United States Patent [19]

Moldavsky

[11] Patent Number: 5,336,564
[45] Date of Patent: Aug. 9, 1994

[54] MINIATURE KEEPER BAR

[75] Inventor: Boris Moldavsky, Dana Point, Calif.

[73] Assignee: Grumman Aerospace Corporation, Bethpage, N.Y.

[21] Appl. No.: 163,361

[22] Filed: Dec. 6, 1993

[51] Int. Cl.5 .................... B32B 15/04; B32B 15/08
[52] U.S. Cl. ............................... 428/418; 29/827; 257/671; 427/96; 427/379; 427/388.1; 427/435; 427/554; 428/457; 428/901; 437/211; 437/214; 437/217; 437/220
[58] Field of Search ............... 29/827; 427/96, 379, 427/388.1, 554, 435; 428/418, 457, 901; 257/671; 437/211, 214, 217, 220

[56] References Cited

U.S. PATENT DOCUMENTS

| 4,721,994 | 1/1988 | Mine et al. | 257/671 |
| 4,827,376 | 5/1989 | Voss | 29/827 X |
| 4,849,857 | 7/1989 | Butt et al. | 257/668 X |
| 5,075,760 | 12/1991 | Nakashima et al. | 257/668 |
| 5,250,842 | 10/1993 | Ikeda | 257/671 X |

Primary Examiner—Michael Lusignan
Attorney, Agent, or Firm—Stetina and Brunda

[57] ABSTRACT

A process for forming a keeper bar upon TAB tape leads for maintaining position of the leads during excise and form operations, integrated circuit placement, and lead bonding, utilizes the steps of immersing TAB tape into a bath of ultraviolet curable resin; directing ultraviolet radiation onto the TAB tape at location(s) where keeper bars are desired, so as to cure the resin to define the keeper bars; washing away uncured resin; and drying the TAB tape.

16 Claims, 4 Drawing Sheets

MINIATURE KEEPER BAR

FIELD OF THE INVENTION

The present invention relates generally to automated integrated circuit placement and more particularly to a process for forming a keeper bar upon TAB tape leads for maintaining position of the leads during excise and form operations, integrated circuit placement, and lead bonding.

BACKGROUND OF THE INVENTION

The use of TAB tape leads in automated integrated circuit placement is well known. The use of such TAB tape leads facilitates the automation of the process of electrically connecting integrated circuits to the substrate upon which they are placed.

Typically, an integrated circuit is positioned upon the holding chuck of an inner lead bonder and held in place by a vacuum. Then, a section of TAB tape having the leads required for electrical interconnection of the integrated circuit to the substrate is positioned immediately above the integrated circuit. The leads inside the window of the TAB tape are properly positioned above the bumps of the integrated circuit and bonded to them. TAB tape with the integrated circuit undergoes electrical and burn-in test if required. The leads thereof are excised and formed so as to contact the interconnection pads of the substrate upon which the integrated circuit is disposed. An integrated circuit is positioned via an automated or manual placement device upon the substrate and bonded to it. The leads thereof are bonded to the electrical interconnection pads of the substrate.

Thus, the use of TAB tape provides a means for facilitating automation and burn-in testing of the integrated circuit placement and interconnection processes.

However, a problem frequently encountered in the use of such TAB tape leads is undesirable bending or movement of the leads formed upon the TAB tape during the excise and form operations, integrated circuit placement, and lead bonding. During TAB tape fabrication the leads are maintained in position via a center support. The center support comprises the central portion of the TAB tape site window where the leads converge. The center support must be removed to facilitate the excise and form operations, integrated circuit placement, and lead bonding.

As will be appreciated, such undesirable bending or movement of the leads may result in misalignment thereof, thus resulting in improper connection thereof to the integrated circuit. Thus, it is beneficial to maintain the leads in their proper positions so as to assure reliable interconnection of the integrated circuit with the substrate upon which it is placed via the TAB tape leads.

Thus, the TAB tape leads are particularly susceptible to such bending or movement proximate the center support thereof, after the center support has been punched or cut away. After removal of the center support, the ends of the TAB tape leads along the cut, i.e. the opening, formed by removal of the center support, are free to move.

The prior art has found it beneficial to form a keeper bar upon the TAB tape leads proximate the center support, such that when the center support is removed therefrom, the keeper bar maintains the position of the leads during the excise and form operations, integrated placement, and lead bonding. However, such prior art keeper bars are formed during fabrication of the TAB tape either by mechanical punching (commonly utilized for three layer tape) or by etching (commonly utilized for two layer tape ). However, it would be beneficial to provide a process for forming keeper bars of a desired smaller configuration upon TAB tape during to the TAB tape fabrication process.

SUMMARY OF THE INVENTION

The present invention specifically addresses and alleviates the above-mentioned deficiencies associated in the prior art. More particularly, the present invention comprises a process for forming a keeper bar upon TAB tape leads for maintaining position of the leads during excise and form operations, integrated circuit placement, and lead bonding. The method comprises the steps of immersing TAB tape into a bath of ultraviolet curable resin; directing ultraviolet radiation onto the TAB tape at location(s) where keeper bars are desired, so as to cure the resin to define the keeper bars; washing away any uncured resin; and drying the TAB tape.

The TAB tape is preferably formed to have leads merged into a center support area so as to provide adequate support thereto during the keeper bar formation process. The leads of the TAB tape merge at the center support, thereby enhancing the structural rigidity thereof. The center support area defines the location of an integrated circuit to be attached to the leads during use of the TAB tape. The center support area is removed or excised from the TAB tape after formation of the keeper bars thereupon.

A mask may optionally be utilized to define the portion of the TAB tape irradiated with the ultraviolet radiation so as to define the keeper bars. Alternatively, a laser may be focused, either with or without a mask, onto the TAB tape so as to define the keeper bars. Those skilled in the art will recognize that various other means, i.e. scanning, sweeping, focusing, imaging, etc., for irradiating the ultraviolet curable resin so as to define keeper bars are likewise suitable.

After washing, the TAB tape is dried, preferably via air drying, prior to being wound onto a reel for storage thereof. Optionally, the TAB tape may be immediately utilized.

The center support may be excised prior to storing the TAB tape upon a reel, preferably via either punching or laser cutting. Those skilled in the art will recognize various other means for excising the center support area of the TAB tape are likewise suitable. Alternatively, the center support area of the TAB tape may remain in place until immediately prior to use thereof.

The keeper bar is preferably formed to have a width of between 0.005 inch and 0.050 inch. The width and thickness of the ribbon is a function of the size of the ultraviolet beam, as well as the cure time.

The depth and/or time of immersion of the TAB tape into the ultraviolet curable resin, as well as the intensity and duration of exposure thereof to the ultraviolet source, are dependent upon the particular curing characteristics of the resin. Those skilled in the art will recognize that various such ultraviolet curable resins are suitable for use in the process of the present invention.

Thus, a solid narrow ribbon of cured epoxy is formed which provides structural support to the inside ends of the TAB tape leads, thereby preventing undesirable bending or movement thereof during the excise and form operations, integrated circuit placement, and lead bonding.

Those skilled in the art will recognize that reduction in the size of the keeper bar inherently leads to higher electronic packaging densities.

These, as well as other advantages of the present invention will be more apparent from the following description and drawings. It is understood that changes in the specific structure shown and described may be made within the scope of the claims without departing from the spirit of the invention.

DETAILED DESCRIPTION OF THE PREFERRED EMBODIMENT

The detailed description set forth below in connection with the appended drawings is intended as a description of the presently preferred embodiment of the invention, and is not intended to represent the only form in which the present invention may be constructed or utilized. The description sets forth the functions and sequence of steps for constructing and operating the invention in connection with the illustrated embodiment. It is to be understood, however, that the same or equivalent functions and sequences may be accomplished by different methods that are also intended to be encompassed within the spirit and scope of the invention.

The process for forming a keeper bar upon TAB tape leads of the present invention is illustrated in FIGS. 1-6 of the drawings which depict a presently preferred embodiment of the invention.

Figure 1:
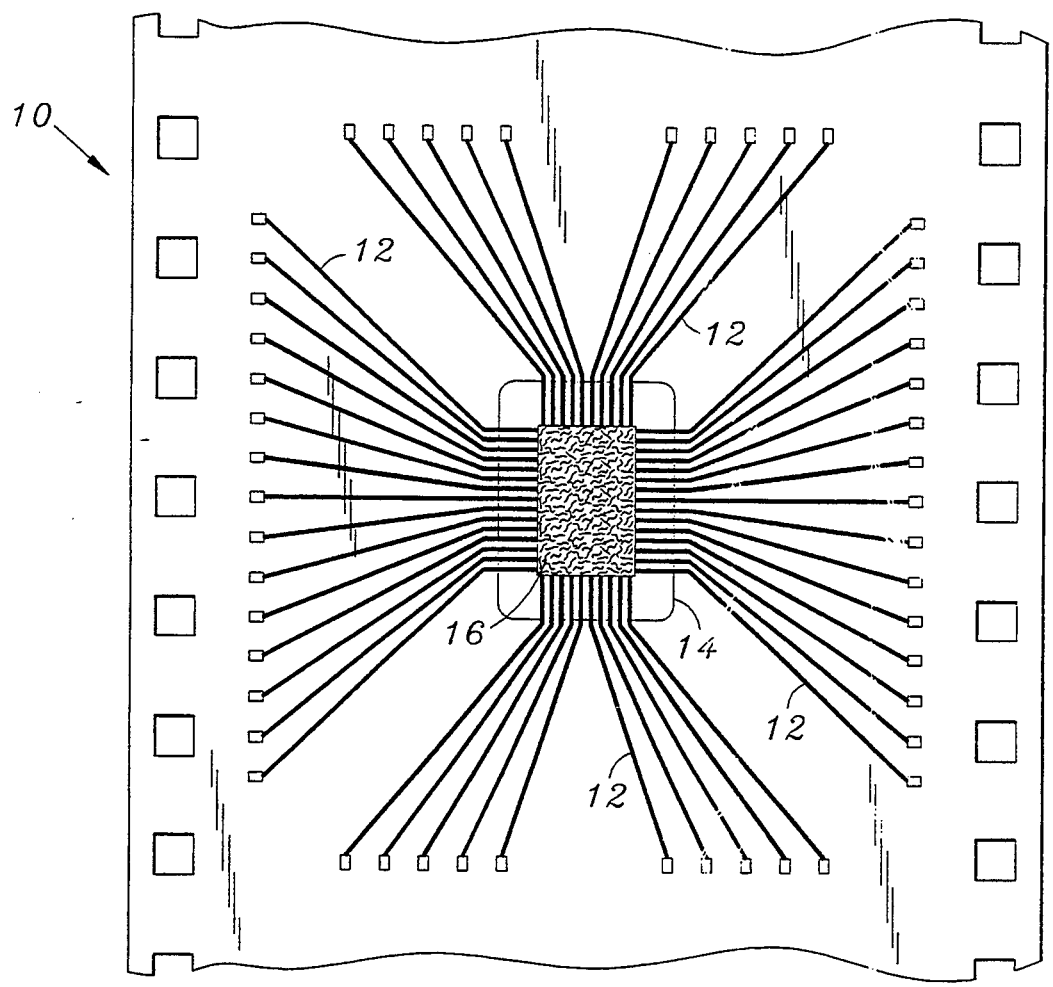
FIG. 1 is a top view of one frame of TAB tape having a center support formed within the tape site window thereof, prior to the formation of keeper bars according to the present invention.
Figure 1A:
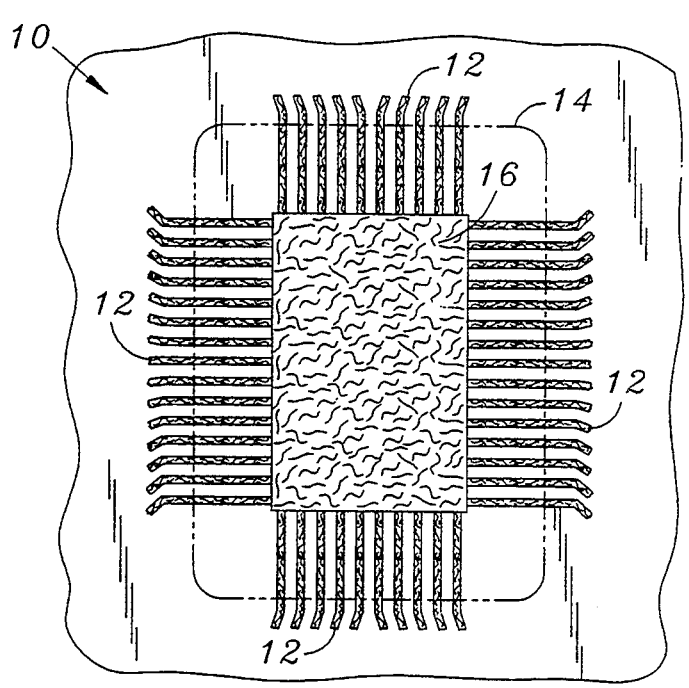
FIG. 1a is an enlarged view of the tape site window of FIG. 1.

Referring now to FIGS. 1 and 1a, TAB tape 10 is provided wherein the leads 12 thereof converge within a tape site window 14 to a common or center support area 16. The merged material of the converging leads 12 provides support to the inner ends of the leads 12 within the tape site window 14 prior to removal or excising of the common center support area 16 as is required prior to use of the TAB tape leads so as to accommodate interconnection thereof to an integrated circuit.

Figure 2:
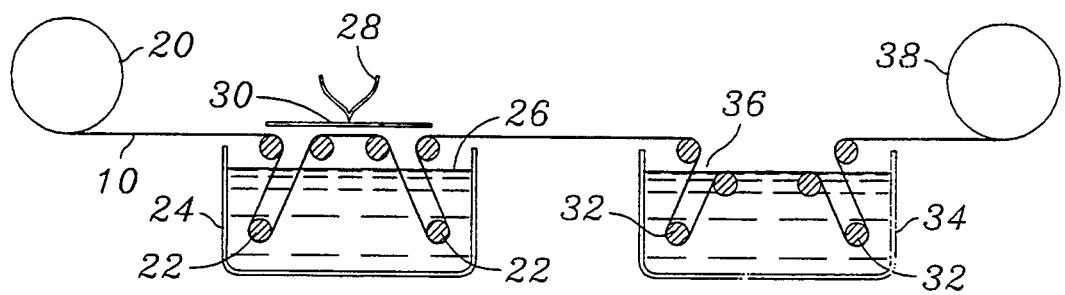
FIG. 2 is a schematic representation of the process of the present invention illustrating the steps of immersing the TAB tape into a bath of UV curable resin, directing UV radiation onto the TAB tape at locations where keeper bars are desired, washing away any uncured resin, and drying the TAB tape.
Figure 6:
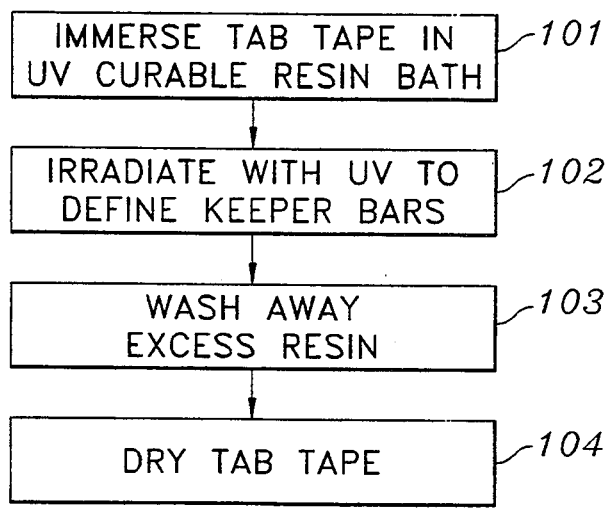
FIG. 6 is a flow chart illustrating the steps of the process of forming a keeper bar upon TAB tape leads according to the present invention.

Referring now to FIGS. 2 and 6, the process for forming a keeper bar upon TAB tape leads of the present invention comprises the steps of immersing TAB tape 10 in UV curable resin 26 (step 101 of FIG. 6), irradiating the TAB tape 10 with ultraviolet radiation via ultraviolet source 28 so as to define keeper bars (step 102 of FIG. 6), washing away any excess resin in bath 34 (step 103 in FIG. 6), and drying the TAB tape 10 (step 104 in FIG. 6).

The step of immersing the TAB tape in ultraviolet resin (step 101 in FIG. 6) preferably comprises removing the TAB tape 10 from a reel 20 and passing the TAB tape over rollers 22 disposed within a tank 24 containing the ultraviolet curable resin 26.

After being coated with or during being immersed into ultraviolet curable resin 26, the TAB tape 10 is irradiated with ultraviolet radiation (step 102 in FIG. 6) via ultraviolet radiation source 28 so as to cure the ultraviolet curable resin in a shape that defines the desired keeper bars. A mask 30 is optionally utilized to assure that ultraviolet radiation is directed only onto that portion of the TAB tape 10 where the keeper bars are to be formed.

After irradiation, the TAB tape 10 travels over rollers 32 into wash tank 34 containing wash solution 36 which removes excess resin from the TAB tape 10. Thus, that resin which has not been cured via ultraviolet radiation is removed within the wash tank 34. The TAB tape is then air dried and wound onto reel 38 for storage thereof.

Figure 3:
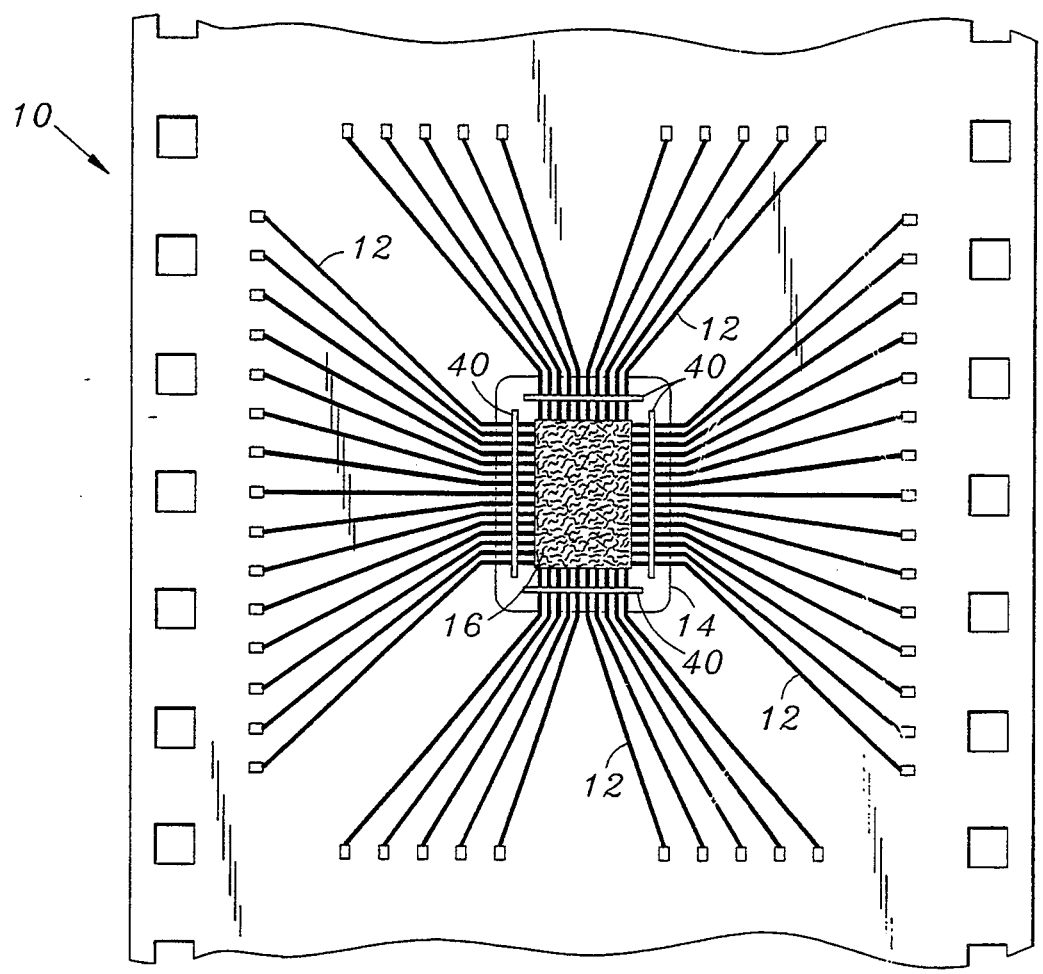
FIG. 3 is a top view of one frame of TAB tape having keeper bars formed upon the leads thereof according to the present invention, and having the center support area thereof remaining in place.
Figure 3A:
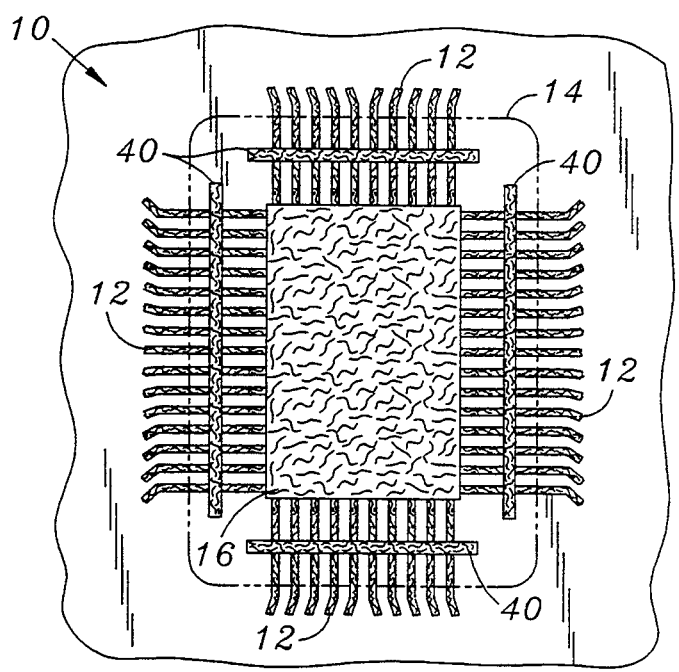
FIG. 3a is an enlarged view of the tape site window of FIG. 3.

Referring to FIGS. 3 and 3a, a frame of the TAB tape having keeper bars 40 formed thereon according to the process of the present invention is illustrated. The keeper bars 40 are formed to have a width or dimension A (as shown in FIG. 3a) of between approximately 0.005 inch and 0.050 inch so as to maintain a high packaging density. The center support 16 has not yet been removed from the TAB tape 10.

Figure 4:
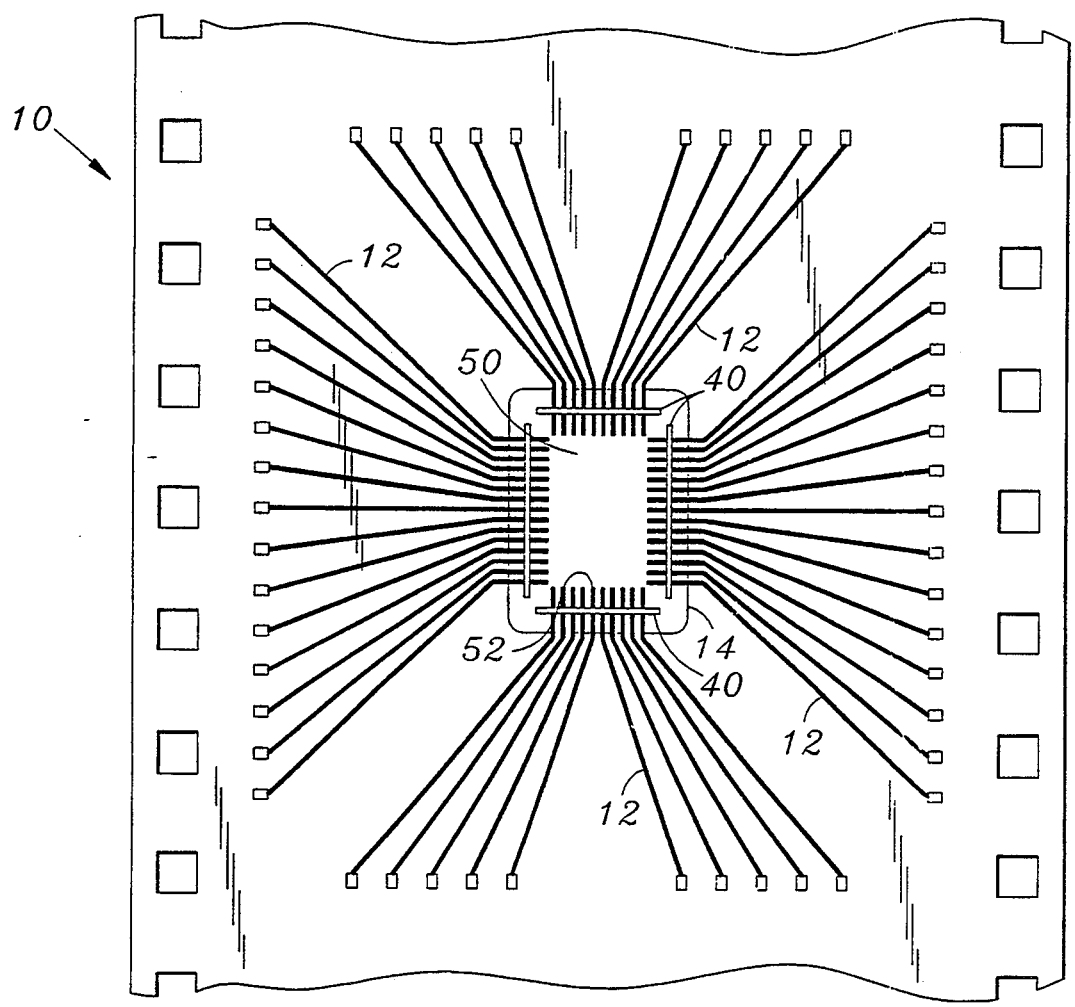
FIG. 4 is a top view of one frame of TAB tape having keeper bars formed upon the leads thereof according to the present invention, and having the center support area thereof removed therefrom.
Figure 4A:
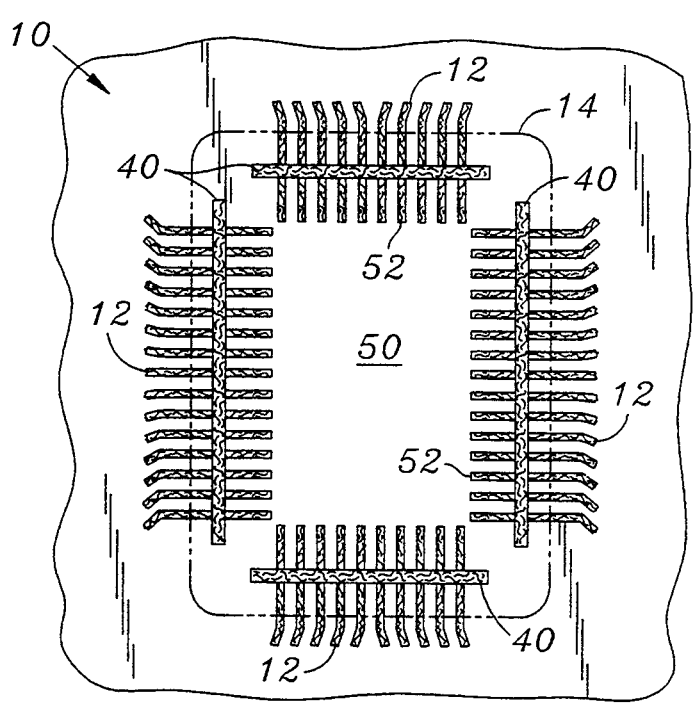
FIG. 4a is an enlarged view of the tape site window of FIG. 4.

Referring now to FIGS. 4 and 4a, the center support area 16 has been removed from the frame of the TAB tape leaving an opening 50 within the center thereof. The center support area 16 must be removed or excised from the TAB tape frame prior to use thereof so as to facilitate attachment of the inside ends 52 of the leads 12 to the contact pads 54 (shown in FIG. 5) of the integrated circuit.

Figure 5:
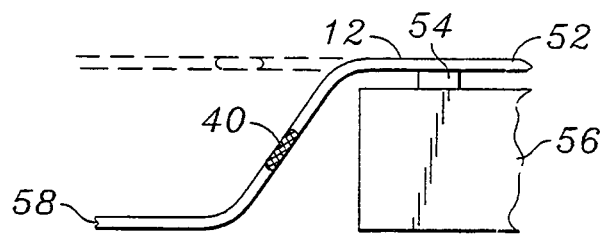
FIG. 5 is a side view of an integrated circuit disposed upon a substrate having TAB tape leads formed and electrically interconnecting the integrated circuit to the substrate, wherein a keeper bar is formed upon the leads according to the present invention.

Referring now to FIG. 5, a TAB tape lead 12 is shown after the excising and forming operations have been completed and the inside end 52 of the lead 12 has been bonded to its corresponding contact bump 54 of the integrated circuit 56. The lead 12 has been bent downwardly so as to facilitate attachment of the outer end 58 thereof to its complimentary contact upon the substrate 55. As will be appreciated, the keeper bar 40 facilitates such forming of the leads 12 while maintaining their desired spacial interrelationships, i.e. preventing distortion or bending thereof.

It is understood that the exemplary miniature keeper bar of the present invention described herein and shown in the drawings represents only a presently preferred embodiment of the invention. Indeed, various modifications and additions may be made to such embodiment without departing from the spirit and scope of the invention. For example, those skilled in the art will recognize that various sizes, shapes, and configurations of the keeper bar are likewise suitable for maintaining proper positioning of the TAB tape leads during the excise and form operations, integrated circuit placement, and lead bonding. Also, those skilled in the art will recognize that other types of resins and means for curing the resins are likewise suitable. Thus, these and other modifications and additions may be obvious to those skilled in the art and may be implemented to adapt the present invention for use in a variety of different applications.

What is claimed is:

1. A process for forming keeper bars upon TAB tape leads for maintaining position of the leads during excise and form operations, integrated circuit placement, and lead bonding, the method comprising the steps of:
   (a) immersing TAB tape into a bath of resin;
   (b) curing the resin to define the keeper bars;
   (c) washing away uncured resin; and
   (d) drying the TAB tape.

2. The process as recited in claim 1 wherein:
   (a) the step of immersing the TAB tape into a bath of resin comprises immersing the TAB tape into a bath of ultraviolet curable resin; and
   (b) the step of curing the resin comprises directing ultraviolet radiation onto the TAB tape at locations where keeper bars are desired.

3. The process as recited in claim 1 further comprising the steps of:
   (a) forming the TAB tape with leads merged into a center support area prior to the step of immersing the TAB tape into the bath of resin, the center support area defining the location of an integrated circuit to be attached to the leads; and
   (b) excising the center support area containing the merged leads.

4. The process as recited in claim 2 further comprising the step of covering the TAB tape with a mask prior to the step of directing ultraviolet radiation thereonto, the mask defining the portion of the TAB tape irradiated with ultraviolet radiation to define the keeper bars.

5. The process as recited in claim 2 wherein the step of directing ultraviolet radiation onto the TAB tape comprises directing the radiation from an ultraviolet laser onto the TAB tape.

6. The process recited in claim 1 wherein the step of drying the TAB tape comprises air drying the TAB tape.

7. The process as recited in claim 3 wherein the step of excising the common area comprises punching the common area.

8. The process as recited in claim 3 wherein the step of excising the center support area comprises laser cutting the common area.

9. TAB tape having a keeper bar formed thereupon for maintaining position of leads formed thereupon during excise and form operations, integrated circuit placement, and lead bonding, said TAB tape formed by a process comprising the steps of:
   (a) immersing TAB tape into a bath of resin;
   (b) curing the resin to define the keeper bars;
   (c) washing away uncured resin; and
   (d) drying the TAB tape.

10. The TAB tapes formed by the process of claim 9 wherein:
    (a) the step of immersing the TAB tape into a bath of resin comprises immersing the TAB tape into a bath of ultraviolet curable resin; and
    (b) the step of curing the resin comprises directing ultraviolet radiation onto the TAB tape at locations where keeper bars are desired.

11. The TAB tape formed by the process of claim 8 wherein the process further comprises the steps of:
    (a) forming the TAB tape with leads merged into a center support area prior to the step of immersing the TAB tape into the bath of resin, the center support area defining the location of an integrated circuit to be attached to the leads; and
    (b) excising the center support area containing the merged leads.

12. The product of claim 10 wherein the process further comprises the step of covering the TAB tape with a mask prior to the step of directing ultraviolet radiation thereonto, the mask defining the portion of the TAB tape irradiated with ultraviolet radiation to define the keeper bars.

13. The product of claim 10 wherein the step of directing ultraviolet radiation onto the TAB tape comprises directing the radiation from an ultraviolet laser onto the TAB tape.

14. The product of claim 9 wherein the step of drying the TAB tape comprises air drying the TAB tape.

15. The product of claim 11 wherein the step of excising the common area comprises punching the common area.

16. The product of claim 11 wherein the step of excising the center support area comprises laser cutting the common area.

* * * * *